United States Patent
Rozak et al.

(10) Patent No.: US 10,593,134 B2
(45) Date of Patent: Mar. 17, 2020

(54) ACCEPTANCE TESTING SYSTEM

(71) Applicant: Sikorsky Aircraft Corporation, Stratford, CT (US)

(72) Inventors: James N. Rozak, Cheshire, CT (US); Michael C. Kingsley, Oxford, CT (US); Michael G. Mastrianni, Orange, CT (US); Daniel Alfred Ciaburri, Cheshire, CT (US)

(73) Assignee: SIKORSKY AIRCRAFT CORPORATION, Stratford, CT (US)

( * ) Notice: Subject to any disclaimer, the term of this patent is extended or adjusted under 35 U.S.C. 154(b) by 419 days.

(21) Appl. No.: 15/319,296

(22) PCT Filed: Jun. 15, 2015

(86) PCT No.: PCT/US2015/035767
§ 371 (c)(1),
(2) Date: Dec. 15, 2016

(87) PCT Pub. No.: WO2015/195522
PCT Pub. Date: Dec. 23, 2015

(65) Prior Publication Data
US 2017/0124785 A1 May 4, 2017

Related U.S. Application Data

(60) Provisional application No. 62/012,591, filed on Jun. 16, 2014.

(51) Int. Cl.
*G06F 17/50* (2006.01)
*G07C 5/08* (2006.01)
(Continued)

(52) U.S. Cl.
CPC ....... *G07C 5/0808* (2013.01); *G06F 17/5009* (2013.01); *G06F 11/3409* (2013.01); *G07C 3/00* (2013.01)

(58) Field of Classification Search
None
See application file for complete search history.

(56) References Cited

U.S. PATENT DOCUMENTS

| 8,744,651 B2 * | 6/2014 | Bates | G05B 23/0254 |
| | | | 701/14 |
| 2008/0312783 A1 * | 12/2008 | Mansouri | G07C 5/0808 |
| | | | 701/31.4 |

(Continued)

OTHER PUBLICATIONS

International Search Report and Written Opinion of the International Searching Authority dated Sep. 16, 2015 in corresponding PCT Application No. PCT/US2015/035767, 9 pages.

*Primary Examiner* — Kibrom K Gebresilassie
(74) *Attorney, Agent, or Firm* — Cantor Colburn LLP (57) ABSTRACT

A system for acceptance testing includes a data acquisition system operable to receive a plurality of sensor inputs from a component under test. The system also includes a health and usage monitoring system (HUMS) interface operable to receive data from a HUMS coupled to the sensor inputs. The system further includes a data processing system operable to determine a plurality of condition indicators based on the sensor inputs acquired by the data acquisition system, receive a plurality of HUMS data from the HUMS interface based on the sensor inputs, compare the condition indicators to the HUMS data, and output a test result based on results of the comparison.

15 Claims, 5 Drawing Sheets

(51) Int. Cl.
*G07C 3/00* (2006.01)
*G06F 11/34* (2006.01)

(56) References Cited

U.S. PATENT DOCUMENTS

| | | | | |
|---|---|---|---|---|
| 2009/0216398 | A1* | 8/2009 | Lynch | G01M 7/025 |
| | | | | 701/29.5 |
| 2009/0300379 | A1* | 12/2009 | Mian | G01D 9/005 |
| | | | | 713/300 |
| 2009/0306909 | A1* | 12/2009 | Mattes | G01M 5/0016 |
| | | | | 702/36 |
| 2010/0219987 | A1* | 9/2010 | Isom | G07C 5/0816 |
| | | | | 340/946 |
| 2011/0057071 | A1* | 3/2011 | Sahasrabudhe | G05D 1/0858 |
| | | | | 244/17.13 |
| 2011/0112878 | A1 | 5/2011 | Isom et al. | |
| 2011/0264310 | A1 | 10/2011 | Bates et al. | |
| 2011/0313726 | A1* | 12/2011 | Parthasarathy | G05B 23/024 |
| | | | | 702/179 |
| 2013/0211737 | A1* | 8/2013 | Batcheller | G01M 7/00 |
| | | | | 702/34 |
| 2013/0274989 | A1 | 10/2013 | Isom et al. | |
| 2015/0339241 | A1* | 11/2015 | Warner | G06F 13/10 |
| | | | | 710/74 |
| 2015/0382085 | A1* | 12/2015 | Lawrie-Fussey | G06K 19/0717 |
| | | | | 340/870.07 |
| 2017/0261406 | A1* | 9/2017 | Dion | G01M 99/008 |

* cited by examiner

ACCEPTANCE TESTING SYSTEM

CROSS-REFERENCE TO RELATED APPLICATIONS

The present application is a 371 National Stage of International Application No. PCT/US2015/035767, filed on Jun. 15, 2015, which claims priority to U.S. Provisional Application No. 62/012,591, filed on Jun. 16, 2014, the contents of which are incorporated by reference herein in their entirety.

BACKGROUND OF THE INVENTION

The subject matter disclosed herein generally relates to a component-level acceptance testing system, and more particularly to an off-board acceptance testing system incorporating an on-board health and usage monitoring system.

Acceptance testing is typically performed as part of a manufacturing process to determine whether a component meets a number of requirements. The component may be subjected to a range of mechanical, electrical, and environmental conditions during acceptance testing to determine whether the component operates and responds as expected within testing limits. Acceptance testing is typically performed as black box testing, where responses to stimulus are observed but the component remains assembled. Due to the black box testing approach, a component that includes foreign object debris within it or subcomponents close to acceptable limits may go undetected during acceptance tests. For instance, tests that simply indicate pass/fail status do not provide an indication as to how close a passing condition came to a limit. Furthermore, a component can have independently observed responses that are independently within acceptable limits but may be problematic when observed in combination with multiple parameters.

Therefore, a need exists to provide an improved acceptance testing system.

BRIEF DESCRIPTION OF THE INVENTION

According to one embodiment, a system for acceptance testing includes a data acquisition system operable to receive a plurality of sensor inputs from a component under test. The system also includes a health and usage monitoring system (HUMS) interface operable to receive data from a HUMS coupled to the sensor inputs. The system further includes a data processing system operable to determine a plurality of condition indicators based on the sensor inputs acquired by the data acquisition system, receive a plurality of HUMS data from the HUMS interface based on the sensor inputs, compare the condition indicators to the HUMS data, and output a test result based on results of the comparison.

In addition to one or more of the features described above or below, or as an alternative, further embodiments could include where inputs to the HUMS are set to simulate an in-flight condition for the component under test.

In addition to one or more of the features described above or below, or as an alternative, further embodiments could include where the in-flight condition is a capture window to trigger capturing and reporting of the HUMS data.

In addition to one or more of the features described above or below, or as an alternative, further embodiments could include where a hardware and software configuration of the HUMS is equivalent to an on-board configuration of the HUMS for in-flight data collection.

In addition to one or more of the features described above or below, or as an alternative, further embodiments could include where the data processing system is further operable to collect a plurality of raw data from the data acquisition system based on the sensor inputs, and to store the raw data in a database in combination with the condition indicators and the HUMS data.

In addition to one or more of the features described above or below, or as an alternative, further embodiments could include where the database collects test data for multiple instances of the component under test and provides a characterization baseline for the multiple instances of the component under test against later recorded in-service data.

In addition to one or more of the features described above or below, or as an alternative, further embodiments could include where condition indicator calculation logic of the data processing system applies a baseline of equivalent processing of the sensor inputs as applied by signal processing logic of the HUMS.

In addition to one or more of the features described above or below, or as an alternative, further embodiments could include where the condition indicator calculation logic is configurable to modify the condition indicators or add new condition indicators.

According to another embodiment, a method of performing acceptance testing includes receiving a plurality of sensor inputs at a data acquisition system from a component under test. HUMS data are received from a HUMS based on the sensor inputs. A test system determines a plurality of condition indicators based on the sensor inputs acquired by the data acquisition system. The test system compares the condition indicators to the HUMS data and outputs a test result based on results of the comparison.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

Exemplary embodiments are directed to an acceptance testing system that performs acceptance testing of a component using a ground-based test system which also incorporates monitoring from a health and usage monitoring system (HUMS) that is configured to operate as part of an on-board vehicle monitoring system. Sensors on the component under test are the same or equivalent to sensors used when the component is installed in a vehicle system. Although described in terms of a vehicle system, embodiments are applicable to numerous types of systems that include a HUMS to monitor a number of parameters while the system is in operation, such as power plant, industrial control system, and the like. Furthermore, the term "vehicle" as used herein includes any type of aircraft, watercraft, or land-based vehicle.

In a complex system, a HUMS can be used to monitor performance as well as predict performance for one or more components of the monitored system. The HUMS may provide health indications to other subsystems and/or link to other systems used for maintenance condition monitoring as well as predictive maintenance systems. A HUMS can provide summary data associated with one or more monitored conditions and may also capture snapshots of data samples surrounding a detected event to aid in diagnosing the monitored system.

In an aircraft-based example, the same sensors installed on an aircraft transmission, as a component under test, are installed for use with a test system. The test system can be relatively compact in size, such as a test stand or cart. The sensors are connected to a HUMS and a data acquisition (DAQ) system of the test system. The HUMS can be configured into a mode of operation that is equivalent to in-flight operation on an aircraft. The output of the HUMS can include raw data and/or condition indicators for a shaft, bearings, and gears of the aircraft transmission as HUMS data. The DAQ system acquires the same sensor inputs that are observed by the HUMS. The test system can use the sensor inputs from the DAQ system to determine condition indicators. A comparison of the condition indicators based on the DAQ system is made relative to the HUMS data. One or more test results are output based on the comparison as part of an acceptance test procedure. The one or more test results can confirm that monitored parameters of the aircraft transmission are within test limits and that there is a substantial correlation between the DAQ-based condition indicators and HUMS-based condition indicators. In addition, other HUMS processing can be applied to determine the health of the aircraft transmission as a HUMS health check. If the aircraft transmission passes the acceptance test procedure and the HUMS health check, the aircraft transmission is cleared for assembly. The test data is stored in a central database.

Figure 1:
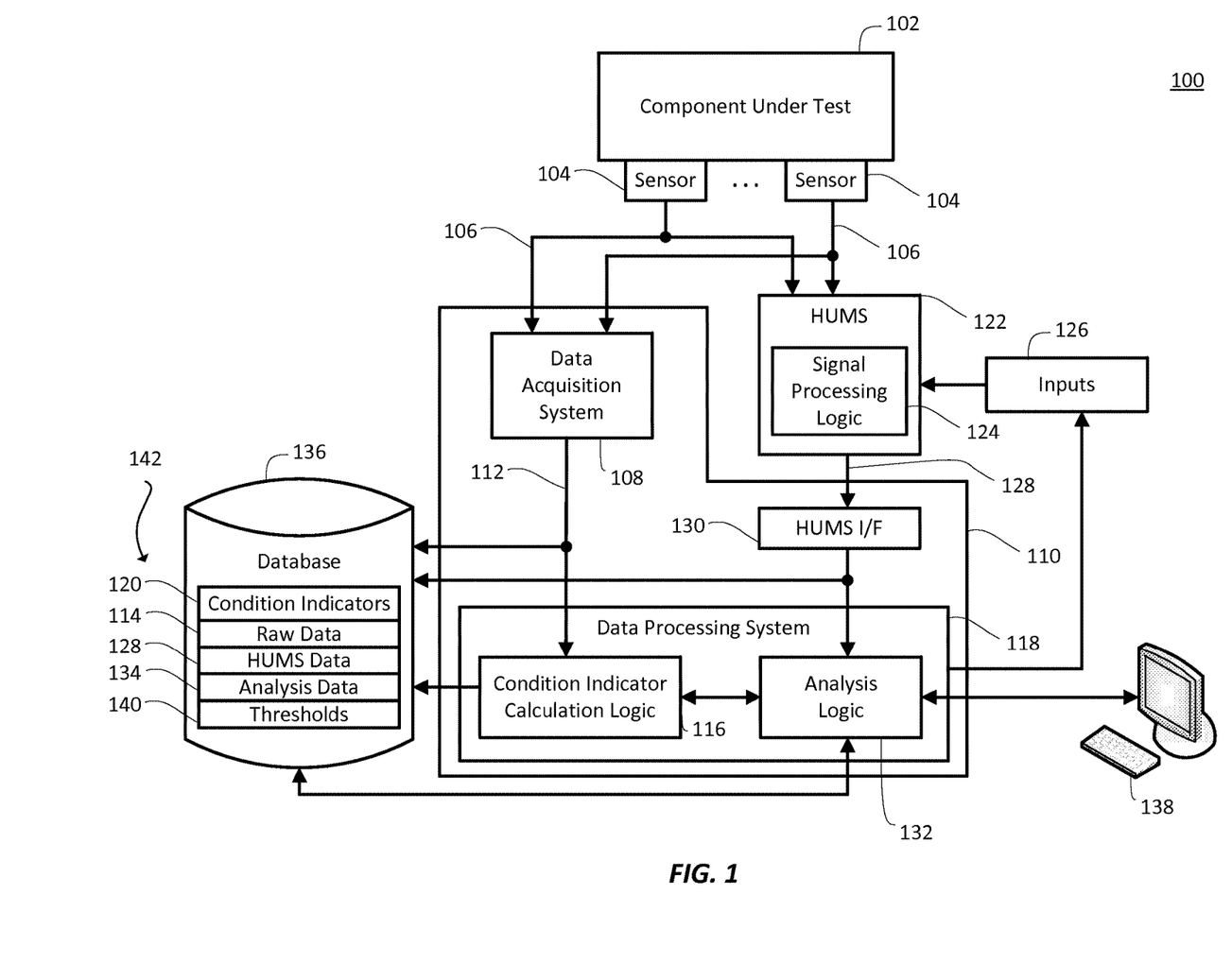
FIG. 1 schematically depicts a block diagram of an acceptance testing system in accordance with embodiments.

Turning now to FIG. 1, an acceptance testing system 100 is depicted in accordance with embodiments. A component under test 102 includes a plurality of sensors 104. The sensors 104 can be, for instance, accelerometers, gyroscopes, strain gauges, temperature sensors, torque sensors, speed sensors, or any type of sensor known in the art. The sensors 104 provide sensor inputs 106 from the component under test 102 to a data acquisition system 108 of a test system 110. The data acquisition system 108 can include, for example, analog-to-digital converters (not depicted) and processing logic (not depicted) to process the sensor inputs 106 as acquired data 112. The acquired data 112 may be raw data 114 that is digitally sampled and converted to engineering units. The data acquisition system 108 may provide the acquired data 112 as the raw data 114 to condition indicator calculation logic 116 of a data processing system 118 of the test system 110. Alternatively, the condition indicator calculation logic 116 may be part of the data acquisition system 108. The condition indicator calculation logic 116 can determine a plurality of condition indicators 120 based on the acquired data 112 from the sensor inputs 106 as acquired by the data acquisition system 108. The condition indicators 120 can summarize data, such as a magnitude at a particular frequency, a root-mean-squared (RMS) value, and/or other statistical values.

In the example of FIG. 1, a HUMS 122 is also coupled to the sensor inputs 106, such that the HUMS 122 can also monitor the sensors 104 of the component under test 102. The HUMS 122 may include signal processing logic 124, which can perform similar data acquisition and condition indicator calculations as the data acquisition system 108 and the condition indicator calculation logic 116. In an exemplary embodiment, a hardware and software configuration of the HUMS 122 is equivalent to an on-board configuration for in-flight data collection in an aircraft environment. The HUMS 122 may monitor a plurality of inputs 126 to determine when to activate monitoring of the sensor inputs 106. For example, the inputs 126 can be set to simulate an in-flight condition for the component under test 102 when the component under test 102 is operable in an aircraft environment. The inputs 126 may be driven by the data processing system 118 in one embodiment. Alternatively, another interface, such as dials, switches, or a separate computer system (not depicted) can set the inputs 126. The inputs 126 can include, for instance, an engine speed, a weight-on-wheels indicator, and the like. The signal processing logic 124 produces HUMS data 128 that can include HUMS-raw data, HUMS-condition indicators, and HUMS health-check values. The in-flight condition establishes a capture window to trigger capturing and reporting of the HUMS data 128.

A HUMS interface 130 of the test system 110 receives the HUMS data 128 based on the sensor inputs 106. The HUMS interface 130 can provide the HUMS data 128 to analysis logic 132 of the data processing system 118. The analysis logic 132 can compare the condition indicators 120 with the HUMS data 128 to determine whether they are substantially correlated. A threshold value, such as a ten percent or twenty percent correlation may be used to confirm that the values are reasonably well aligned. A test result based on the comparison can be provided in analysis data 134 as output to a database 136 and/or a user interface 138. The database 136 can be embodied in non-volatile storage and may be accessible by other systems (not depicted). The user interface 138 can include a display and one or more user input devices, e.g., a keyboard and mouse, touch-sensitive display, etc.

Acceptance test thresholds and HUMS health check thresholds can be stored as thresholds 140 in the database 136. The data processing system 118 can collect a plurality of raw data 114 from the data acquisition system 108 and store the raw data 114 in the database 136 in combination with the condition indicators 120, the HUMS data 128, and the analysis data 134. By verifying that the condition indicators 120 are within limits defined by the thresholds 140 and closely align with the HUMS data 128, a higher degree of confidence in test results may be realized. Storage of the raw data 114 may support supplemental analysis such as developing secondary indicators and data fusion across data from multiple sensors 104.

The database 136 can be used to collect test data 142 (e.g., condition indicators 120, raw data 114, HUMS data 128, analysis data 134, and/or thresholds 140) for multiple instances of the component under test 102 and may provide a characterization baseline for the multiple instances of the component under test 102 against later recorded in-service data. For example, after the component under test 102 is deployed in the field, the test data 142 can be used as a baseline from which changes are observed to look for trends headed toward degraded performance that may trigger a maintenance action. Additionally, the test data 142 can indicate how close the condition indicators 120 were to an acceptable value of the thresholds 140. Further, if unexpected events are detected in the field, the test data 142 can be examined to determine if different values for the thresholds 140 should be used or different definitions for the condition indicators 120 should be established. The condition indicator calculation logic 116 may be configurable to modify the condition indicators 120 or add new condition indicators 120.

Figure 2:
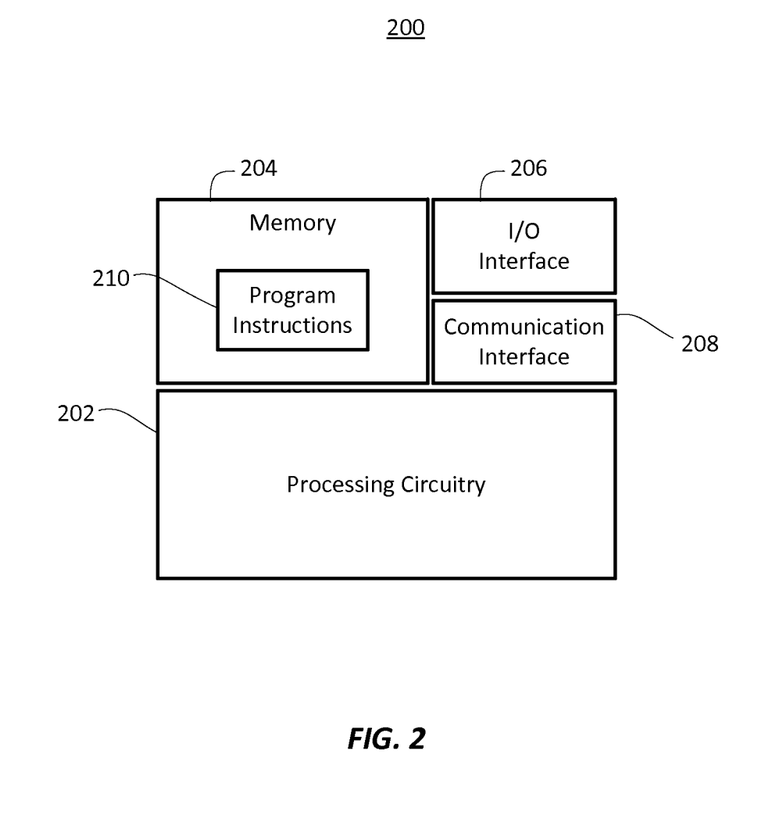
FIG. 2 schematically depicts a block diagram of a processing system in accordance with embodiments.

FIG. 2 schematically depicts a block diagram of a processing system 200 in accordance with embodiments. One or more instances of the processing system 200 can be embodied in the data acquisition system 108 of FIG. 1, in the data processing system 118 of FIG. 1, and/or in the HUMS 122 of FIG. 1. The processing system 200 includes processing circuitry 202, memory 204, an input/output (I/O) interface 206, and a communication interface 208. The processing circuitry 202 can be any type or combination of computer processors, such as a microprocessor, microcontroller, digital signal processor, application specific integrated circuit, programmable logic device, and/or field programmable gate array, and is generally referred to as a central processing unit (CPU). The memory 204 can include volatile and non-volatile memory, such as random access memory (RAM), read only memory (ROM), or other electronic, optical, magnetic, or any other computer readable storage medium onto which data and control logic as described herein are stored. Therefore, the memory 204 is a tangible storage medium where program instructions 210 executable by the processing circuitry 202 are embodied in a non-transitory form. The program instructions 210 can include, for example, instructions to implement portions of the data acquisition system 108 of FIG. 1, the condition indicator calculation logic 116 of FIG. 1, the signal processing logic 124 of FIG. 1, and/or the analysis logic 132 of FIG. 1.

The I/O interface 206 can include a variety of input interfaces, output interfaces, and support circuitry. For example, in various embodiments the I/O interface 206 can acquire data from the sensors 104 of FIG. 1, access the database 136 of FIG. 1, interface with inputs 126 of FIG. 1, and/or interface with the user interface 138 of FIG. 1. The communication interface 208 may be included to support wired, wireless, and/or fiber optic network communication. Alternatively, the communication interface 208 can be used for point-to-point communication, such as interfacing the HUMS 122 of FIG. 1 to the HUMS interface 130 of FIG. 1 and/or the data acquisition system 108 of FIG. 1 to the data processing system 118 of FIG. 1.

Figure 3:
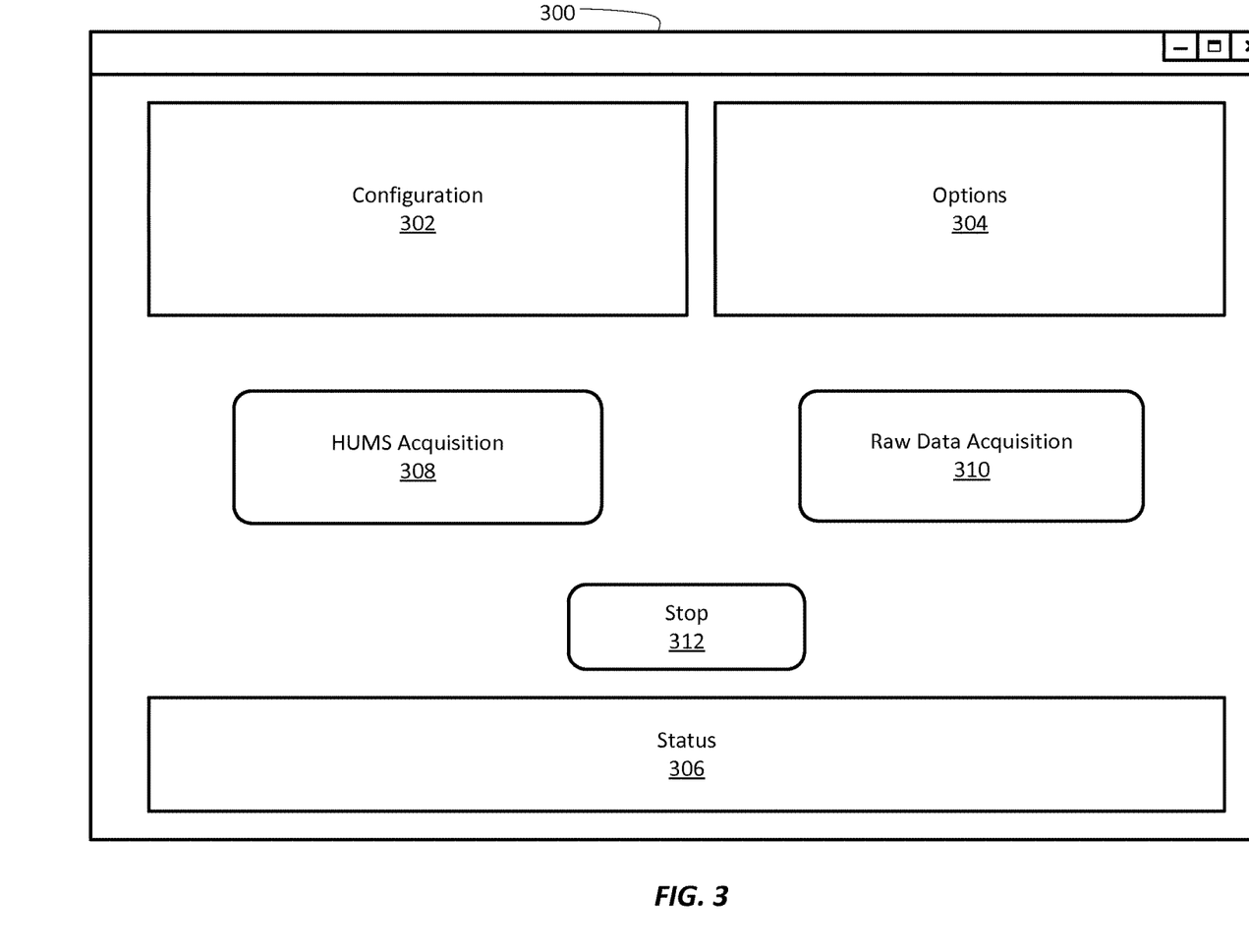
FIG. 3 depicts a user interface for the acceptance testing system of FIG. 1 in accordance with embodiments.

FIG. 3 depicts a user interface 300 for the acceptance testing system 100 of FIG. 1 in accordance with embodiments. The user interface 300 may be displayed on the user interface 138 of FIG. 1. In the example of FIG. 3, the user interface 300 includes a configuration portion 302, options 304, status 306, a HUMS acquisition button 308, a raw data acquisition button 310, and a stop button 312. Other types of information and I/O may also be made available through the user interface 300. The configuration portion 302 can be used to establish test identification parameters, such as a test operator name, a date, a test identifier, an identifier of the component under test 102 of FIG. 1, and the like. The options 304 may be used to establish operating parameters of the component under test 102 of FIG. 1. The status 306 can display a status of test progress, storage remaining, and prompt the test operator with specific instructions. The HUMS acquisition button 308 may drive the inputs 126 of FIG. 1 to trigger capturing and reporting of the HUMS data 128 of FIG. 1. The raw data acquisition button 310 may prompt the data acquisition system 108 of FIG. 1 to capture the raw data 114 of FIG. 1 for a period of time. The acquisition of the HUMS data 128 of FIG. 1 and the raw data 114 of FIG. 1 can occur over different predetermined periods of time. The stop button 312 can be used to halt data acquisition.

Figure 4:
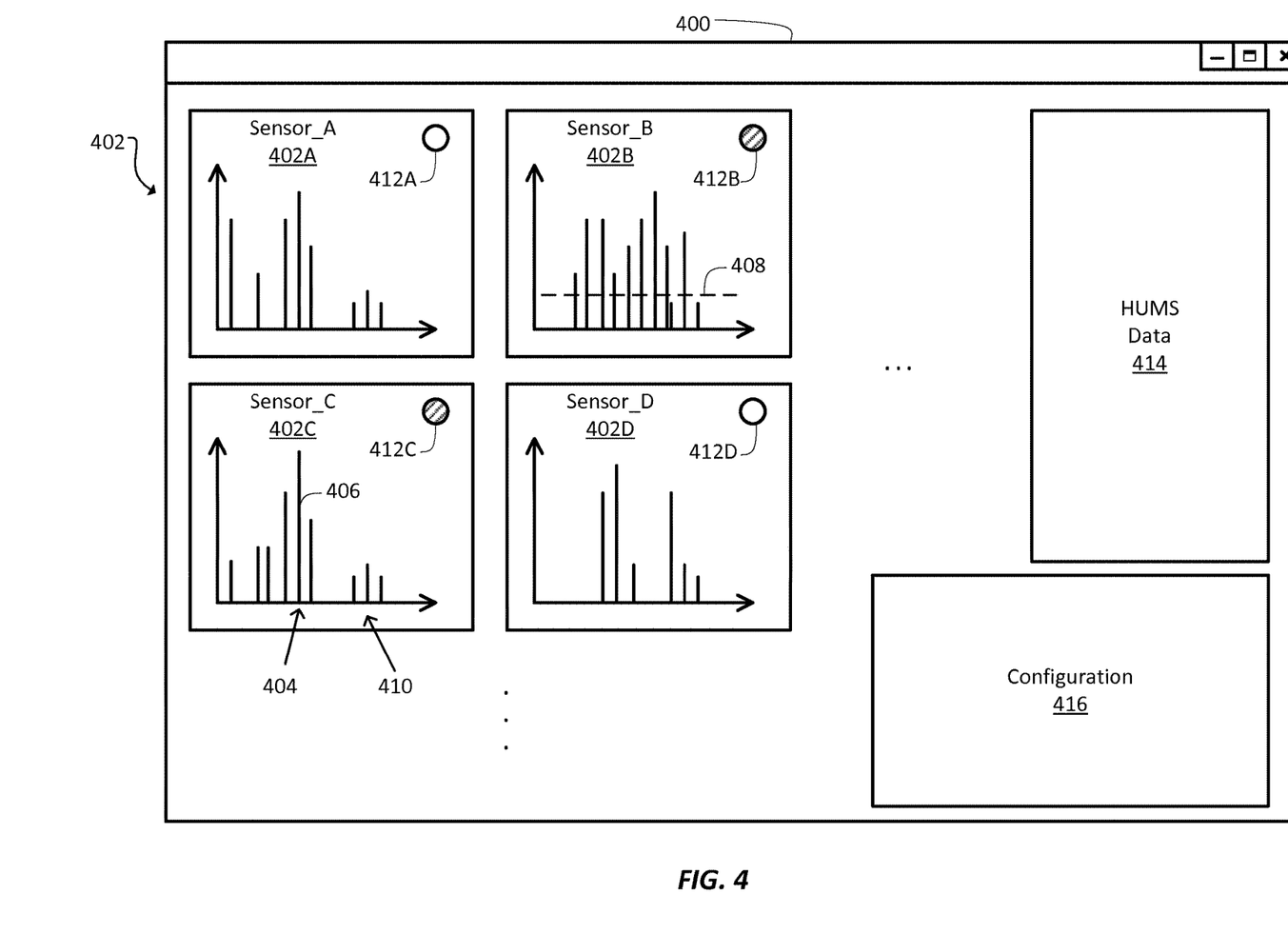
FIG. 4 depicts a monitoring interface for the acceptance testing system of FIG. 1 in accordance with embodiments.

FIG. 4 depicts a monitoring interface 400 for the acceptance testing system 100 of FIG. 1 in accordance with embodiments. The monitoring interface 400 may be displayed on the user interface 138 of FIG. 1, for instance, by the analysis logic 132 of FIG. 1. The monitoring interface 400 can display a number of charts 402 associated with data from the sensors 104 of FIG. 1. As one example, a chart 402A is associated with sensor inputs 106 of FIG. 1 from one of the sensors 104 of FIG. 1 (sensor_A), while charts 402B, 402C, and 402D are associated with other instances of the sensors 104 of FIG. 1 (e.g., sensor_B, sensor_C, sensor_D). Additional charts 402 may be defined for other sensors 104 of FIG. 1. The charts 402 of FIG. 4 are formatted as frequency response spectrums; however, other formats may be realized in various embodiments. The charts 402 can summarize the raw data 114 of FIG. 1 over a period of time using, for example, a Fast-Fourier Transform (FFT) or signal processing techniques known in the art. The condition indicators 120 of FIG. 1 and thresholds 140 of FIG. 1 may be defined in terms of particular frequency values 404 and magnitudes 406. Alternatively, the condition indicators 120 of FIG. 1 and thresholds 140 of FIG. 1 may be defined in broader terms, such as a broadband RMS level 408 across a spectrum of frequency response data. The charts 402 assist in visualizing other spectral data 410 that may not directly map to the condition indicators 120 of FIG. 1.

A health status summary 412A, 412B, 412C, and 412D can summarize whether the condition indicators 120 of FIG. 1 exceed the thresholds 140 of FIG. 1 relative to charts 402A, 402B, 402C, and 402D respectively. The health status summary 412A, 412B, 412C, and 412D may change in color, intensity, blinking, or other characteristic to distinguish between healthy and unhealthy conditions. The health status summary 412A, 412B, 412C, and 412D may also reflect that the condition indicators 120 of FIG. 1 substantially align with the HUMS data 128 of FIG. 1 as part of a healthy/unhealthy indication.

In FIG. 4, HUMS data 414 that are associated with the charts 402A, 402B, 402C, and 402D can be separately displayed or overlaid upon the charts 402A, 402B, 402C, and 402D. A configuration region 416 can be used to rescale the charts 402A, 402B, 402C, and 402D or modify the chart type or other configuration characteristics for the monitoring interface 400. A pop-up interface or other editing tool can be used to select which of the sensors 104 of FIG. 1 should be charted on the monitoring interface 400. It will be understood that the monitoring interface 400 of FIG. 4 represents one example and numerous variations to display the test data 142 of FIG. 1 are contemplated.

Figure 5:
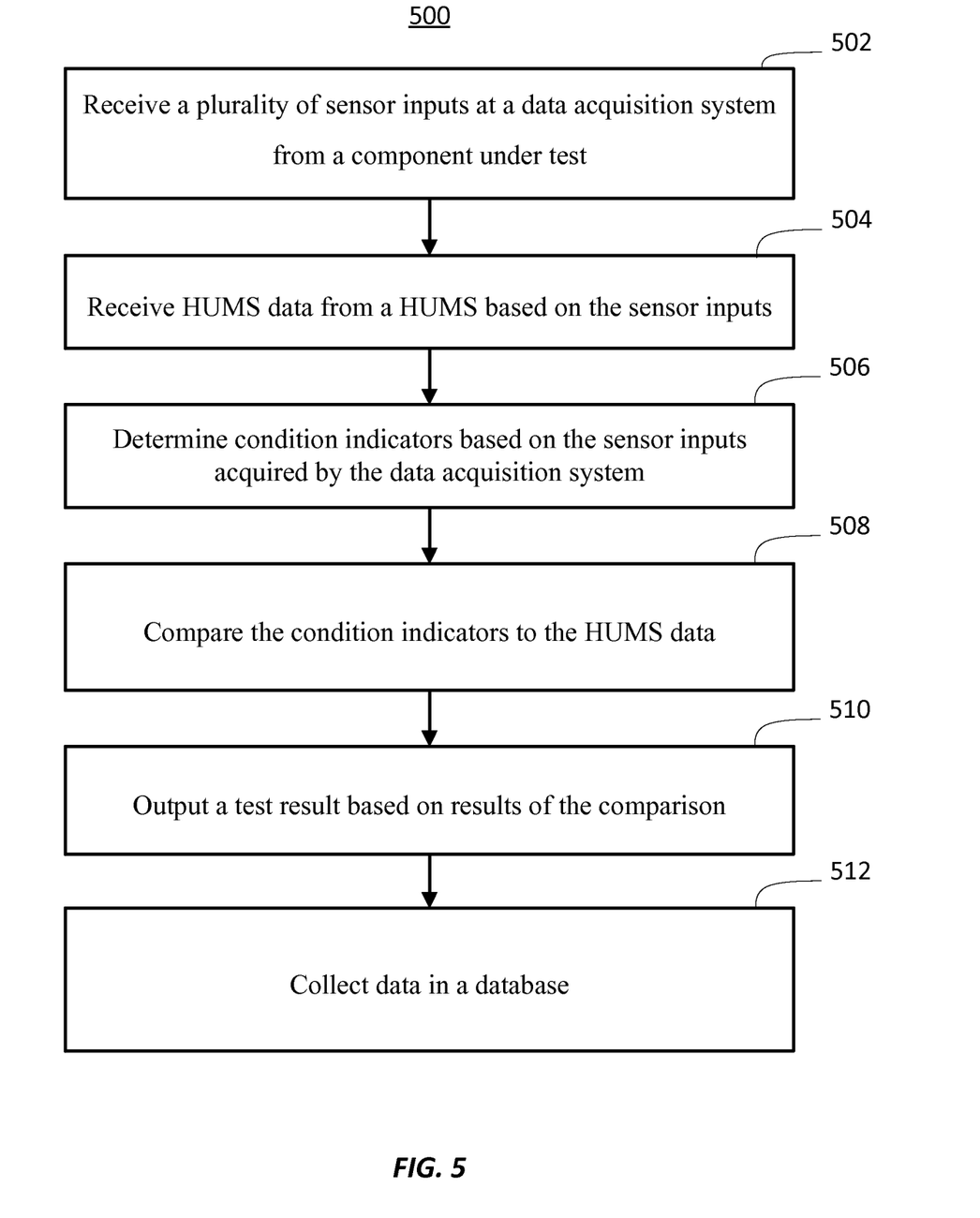
FIG. 5 depicts a process flow for an acceptance testing method in accordance with embodiments.

FIG. 5 depicts a process flow for an acceptance testing method 500 in accordance with embodiments. The acceptance testing method 500 may be performed by the test system 110 of FIG. 1. Accordingly, the acceptance testing method 500 is described in reference to FIGS. 1-5. At block 502, sensor inputs 106 are received at a data acquisition system 108 from a component under test 102. At block 504, HUMS data 128 are received at HUMS interface 130 from a HUMS 122 based on the sensor inputs 106. At block 506, the test system 110 determines a plurality of condition indicators 120 based on the sensor inputs 106 acquired by the data acquisition system 108. At block 508, the test system 110 compares the condition indicators 120 to the HUMS data 128. At block 510, the test system 110 outputs a test result based on results of the comparison. The test result can be visually output as one or more health status summary, such as one or more of the health status summary 412A-412D. At bock 512, the test data 142 can be collected in database 136 as test results.

As previously described, a plurality of inputs 126 to the HUMS 122 can be set to simulate an in-flight condition for the component under test 102. The in-flight condition may be a capture window to trigger capturing and reporting of the HUMS data 128, where a hardware and software configuration of the HUMS 122 is equivalent to an on-board configuration of the HUMS 122 for in-flight data collection. As part of data collection and analysis, a plurality of raw data 114 can be collected from the data acquisition system 108 based on the sensor inputs 106 and stored in the database 136 in combination with the condition indicators 120 and the HUMS data 128. The database 136 may collect test data 142 for multiple instances of the component under test 102 and provide a characterization baseline for the multiple instances of the component under test 102 against later recorded in-service data. To develop the condition indicators 120, the test system 110 may apply a baseline of equivalent processing of the sensor inputs 106 as applied by the signal processing logic 124 of the HUMS 122. Accordingly, substantial alignment between the condition indicators 120 and the HUMS data 128 should occur for sensor inputs 106 observed at substantially the same time when both the test system 110 and HUMS 122 are operating correctly.

Technical effects include performance of acceptance testing of a component using a ground-based test system which also incorporates monitoring from a HUMS that is configured to operate as part of an on-board vehicle monitoring system. Using a HUMS that is configured for in-flight operation can establish a baseline for observing future changes in performance characteristics in the component and sensing system over time. The HUMS also assists in increasing confidence in pass/fail determinations for component acceptance testing.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A system for acceptance testing, comprising:
a data acquisition system operable to receive a plurality of sensor inputs from a component under test;
a health and usage monitoring system (HUMS) interface operable to receive data from a HUMS coupled to the sensor inputs; and
a data processing system operable to perform a test of the HUMS by determining a plurality of condition indicators including at least one of a magnitude of a particular frequency, and a root mean square (RMS) value of the particular frequency based on the sensor inputs acquired by the data acquisition system, receive a plurality of HUMS data from the HUMS interface based on the sensor inputs, compare the condition indicators to the HUMS data, and output a test result based on results of the comparison.

2. The system according to claim 1, wherein a plurality of inputs to the HUMS are set to simulate an in-flight condition for the component under test.

3. The system according to claim 2, wherein the in-flight condition comprises a capture window to trigger capturing and reporting of the HUMS data.

4. The system according to claim 2, wherein a hardware and software configuration of the HUMS is equivalent to an on-board configuration of the HUMS for in-flight data collection.

5. The system according to claim 1, wherein the data processing system is further operable to collect a plurality of raw data from the data acquisition system based on the sensor inputs, and to store the raw data in a database in combination with the condition indicators and the HUMS data.

6. The system according to claim 5, wherein the database collects test data for multiple instances of the component under test and provides a characterization baseline for the multiple instances of the component under test against later recorded in-service data.

7. The system according to claim 1, wherein condition indicator calculation logic of the data processing system applies a baseline of equivalent processing of the sensor inputs as applied by signal processing logic of the HUMS.

8. The system according to claim 7, wherein the condition indicator calculation logic is configurable to modify the condition indicators or add new condition indicators.

9. A method of performing acceptance testing, comprising:
receiving a plurality of sensor inputs at a data acquisition system from a component under test;
receiving health and usage monitoring system (HUMS) data from a HUMS based on the sensor inputs;
testing the HUMS with a test system by determining a plurality of condition indicators including at least one of a magnitude of a particular frequency, and a root mean square (RMS) value of the particular frequency based on the sensor inputs acquired by the data acquisition system;
comparing, by the test system, the condition indicators to the HUMS data; and
outputting, by the test system, a test result based on results of the comparison.

10. The method according to claim 9, wherein a plurality of inputs to the HUMS are set to simulate an in-flight condition for the component under test.

11. The method according to claim 10, wherein the in-flight condition comprises a capture window to trigger capturing and reporting of the HUMS data.

12. The method according to claim 10, wherein a hardware and software configuration of the HUMS is equivalent to an on-board configuration of the HUMS for in-flight data collection.

13. The method according to claim 9, further comprising:
collecting a plurality of raw data from the data acquisition system based on the sensor inputs; and
storing the raw data in a database in combination with the condition indicators and the HUMS data.

14. The method according to claim 13, wherein the database collects test data for multiple instances of the component under test and provides a characterization baseline for the multiple instances of the component under test against later recorded in-service data.

15. The method of according to claim 9, further comprising:
 applying, by the test system, a baseline of equivalent processing of the sensor inputs as applied by signal processing logic of the HUMS.

* * * * *